US009240777B2

(12) United States Patent
Shinohara et al.

(10) Patent No.: US 9,240,777 B2
(45) Date of Patent: Jan. 19, 2016

(54) SWITCHING CONTROL DEVICE

(71) Applicant: Kabushiki Kaisha Toshiba, Minato-ku (JP)

(72) Inventors: Naoto Shinohara, Kawasaki (JP); Yusuke Shibano, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/480,781

(22) Filed: Sep. 9, 2014

(65) Prior Publication Data
US 2015/0188530 A1 Jul. 2, 2015

(30) Foreign Application Priority Data

Dec. 26, 2013 (JP) ................. 2013-269507

(51) Int. Cl.
H02M 7/5387 (2007.01)
H03K 7/08 (2006.01)
H02P 29/00 (2006.01)
H03K 3/011 (2006.01)
H03K 17/082 (2006.01)
H03K 17/14 (2006.01)
H03K 17/08 (2006.01)

(52) U.S. Cl.
CPC ............ H03K 7/08 (2013.01); H02M 7/53875 (2013.01); H02P 29/0088 (2013.01); H03K 3/011 (2013.01); H03K 17/0822 (2013.01); H03K 17/145 (2013.01); H03K 2017/0806 (2013.01)

(58) Field of Classification Search
CPC ......... H02M 7/5387–7/53875; H02P 29/0044; H02P 29/0088
See application file for complete search history.

(56) References Cited

U.S. PATENT DOCUMENTS

| 5,923,135 | A  | * | 7/1999  | Takeda   | B60L 11/1803 318/432 |
| 6,643,150 | B2 | * | 11/2003 | Kawakami | H02M 7/53875 363/132 |
| 7,453,679 | B2 | * | 11/2008 | Yokai    | H02M 1/32 361/103 |
| 8,319,463 | B2 | * | 11/2012 | Sasaki   | H02M 7/48 318/400.3 |
| 8,786,227 | B2 | * | 7/2014  | Kubo     | B60H 1/3213 310/16 |
| 2014/0197772 | A1 | * | 7/2014  | Morita   | H02P 27/08 318/503 |
| 2015/0036400 | A1 | * | 2/2015  | Webster  | H02M 1/32 363/98 |
| 2015/0211938 | A1 | * | 7/2015  | Imakiire | H02P 29/0088 702/133 |

FOREIGN PATENT DOCUMENTS

JP 2002-272125 9/2002
JP 2009-254158 10/2009

* cited by examiner

Primary Examiner — Patrick O'Neill
(74) Attorney, Agent, or Firm — Oblon, McClelland, Maier & Neustadt, L.L.P.

(57) ABSTRACT

A switching control device controls a drive circuit including one or more series circuits each one of which includes an upper switching element and a lower switching element. The switching control device includes an upper side temperature detection unit detecting a temperature of the upper switching element (hereinafter, "an upper side temperature"), a lower side temperature detection unit detecting a temperature of the lower switching element (hereinafter, "a lower side temperature"), and a signal generation circuit adding an offset value to a command voltage of a PWM signal output to the upper and lower switching elements to generate and output a PWM signal to the switching elements so that the upper and lower side temperatures approximate to each other.

6 Claims, 14 Drawing Sheets

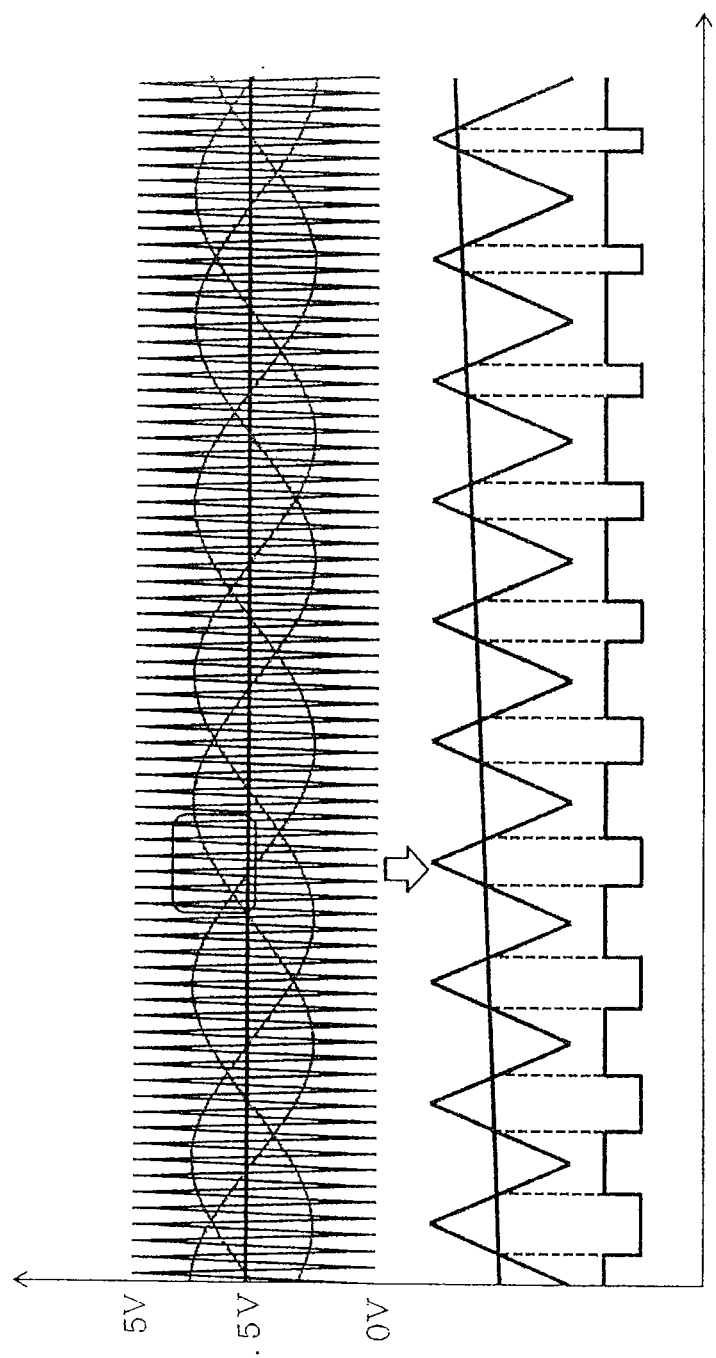

FIG. 10C U-PHASE PWM SIGNAL

SWITCHING CONTROL DEVICE

CROSS-REFERENCE TO RELATED APPLICATIONS

This application is based upon and claims the benefit of priority from the prior Japanese Patent Application No. 2013-269507 filed on Dec. 26, 2013, the entire contents of which are incorporated herein by reference.

FIELD

Embodiments described herein relate to a switching control device controlling in a PWM control manner a drive circuit configured of one or more series circuits each one of which includes upper switching elements and lower switching elements.

BACKGROUND

Switching elements, such as MOSFETs, configuring a drive circuit such as an inverter circuit generate heat when switching of the elements is controlled. Free wheel diodes are connected in parallel to the switching elements respectively. Each free wheel diode also generates heat when a reflux current flows therethrough. Various techniques have been proposed which are directed to equalizing heat balance between the switching element and the free wheel diode.

Inverter circuits often employ an air-cooled or water-cooled cooling structure for the purpose of suppressing heat generation. However, since space is limited in a peripheral area of the inverter circuit, not all the switching elements can be cooled uniformly with the result of difference in heat generation between the upper and lower switching elements. However, no related art has provided means to cope with the above-described problem.

BRIEF DESCRIPTION OF THE DRAWINGS

FIGS. 8A to 8C are graphs showing carrier signal, voltage command signal and U-phase positive PWM signal (reference voltage=2.5 volts);

FIGS. 10A to 10C are graphs showing carrier signal, voltage command signal and U-phase positive PWM signal (reference voltage<2.5 volts);

DETAILED DESCRIPTION

In general, according to one embodiment, a switching control device controls a drive circuit including one or more series circuits each one of which includes an upper switching element and a lower switching element. The switching control device includes an upper side temperature detection unit detecting a temperature of the upper switching element (hereinafter, "an upper side temperature"), a lower side temperature detection unit detecting a temperature of the lower switching element (hereinafter, "a lower side temperature"); and a signal generation circuit adding an offset value to a command voltage of a PWM signal output to the upper and lower switching elements to generate a PWM signal, outputting the PWM signal to the switching elements so that the upper and lower side temperatures approximate to each other.

According to another embodiment, a switching control device controls a drive circuit including one or more series circuits each one of which includes an upper switching element and a lower switching element. The switching control device includes a temperature detection unit detecting a temperature of either upper or lower switching element, a temperature estimation unit estimating a temperature of the upper switching element (hereinafter, "an upper side temperature") and a temperature of the lower switching element (hereinafter, "a lower side temperature") based on the detected temperature and a control parameter varying based on switching control, and a signal generation circuit adding an offset value to a command voltage of a PWM signal output to the upper and lower switching elements to generate a PWM signal, outputting the PWM signal to the switching elements so that the upper and lower side temperatures approximate to each other.

Figure 1:
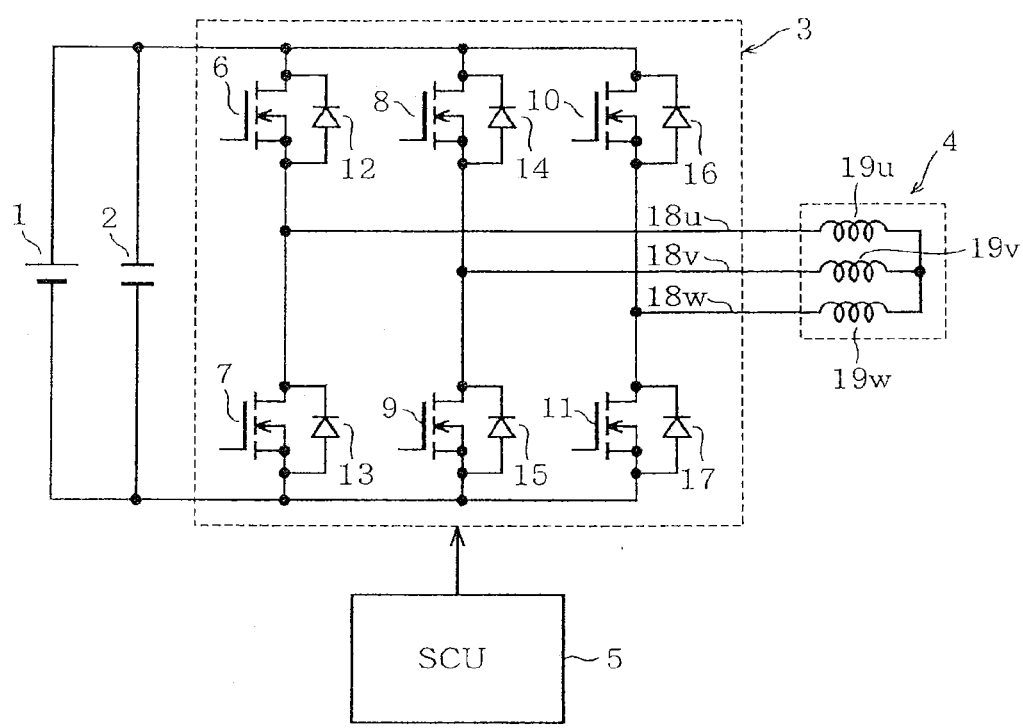
FIG. 1 is a circuit diagram showing a motor control system according to a first embodiment.
Figure 2:
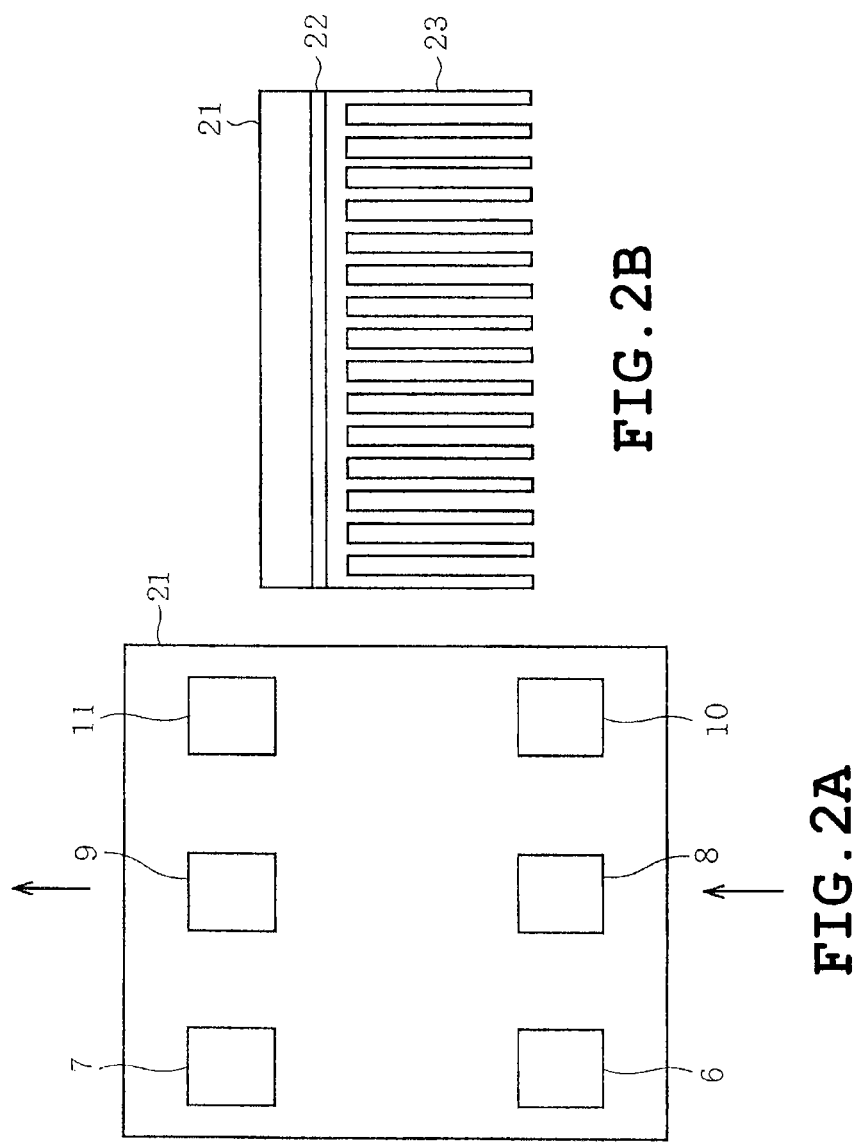
FIGS. 2A and 2B show a cooling mechanism for the inverter circuit (an air cooling system)

A first embodiment will be described with reference to FIGS. 1 to 11. Referring to FIG. 1, a motor control system is shown which includes a DC power supply 1, a smoothing capacitor 2 and an inverter circuit 3 (a drive circuit) both connected between both ends of the DC power supply 1, an electric motor 4 connected to respective phase output terminals of the inverter circuit 3, and a switching control unit (SCU) 5 (a signal generation circuit) controlling the inverter circuit 3. The inverter circuit 3 includes six N-channel MOSFETs (switching elements) 6 to 11 connected into a three-phase bridge configuration (n=1). Free wheel diodes 12 to 17 are connected between drains and sources of the MOSFETs 6 to 11 respectively. More specifically, the MOSFETs 6 and 7, the MOSFETs 8 and 9 and the MOSFETs 10 and 11 configure U-phase, V-phase and W-phase arms (series circuits, half bridge circuits) respectively.

The phase output terminals of the inverter circuit 3 are connected via harnesses 18$u$, 18$v$ and 18$w$ to one ends of star-connected stator windings 19$u$, 19$v$ and 19$w$ of the motor 4 respectively. The SCU 5 is configured of a microcomputer, for example, and outputs pulse width modulation (PWM) signals as gate drive signals to the gates of the MOSFETs 6 to 11 of the inverter circuit 3.

Figure 3:
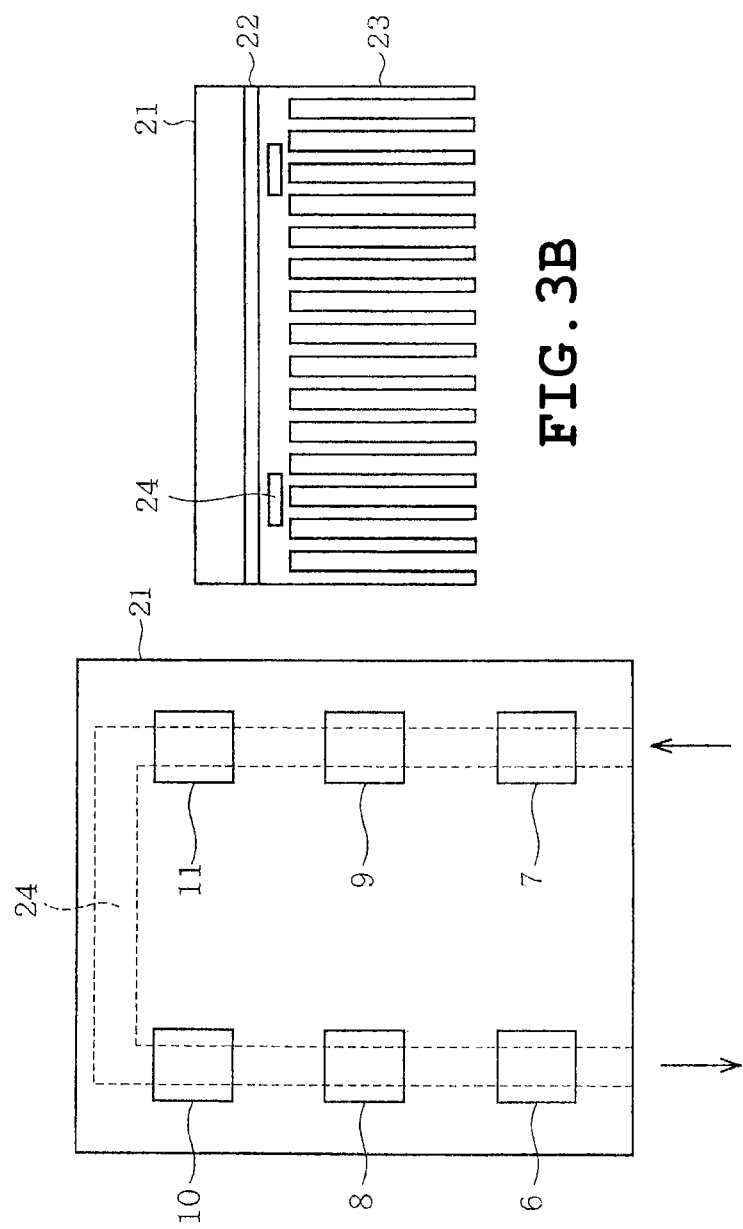
FIGS. 3A and 3B show another cooling mechanism for the inverter circuit (a water cooling system)

The construction for cooling the MOSFETs 6 to 11 of the inverter circuit 3 will now be described with reference to FIGS. 2A and 2B and 3. FIGS. 2A and 2B show an air cooling system. The MOSFETs 6 to 11 (and the free wheel diodes 12 to 17 not shown in FIG. 2A) are mounted on a surface of a substrate 21. Cooling fins 23 are mounted via an insulating material on a reverse face of the substrate 21. Cooling air is caused to flow from the side of the positive MOSFETs 6, 8 and 10 to the side of the negative MOSFETs 7, 9 and 11 by a blower fan (not shown). In this case, since the cooling air is firstly subjected to heat from the upstream MOSFETs 6, 8 and 10 thereby to be warmed, the cooling effect on the downstream MOSFETs 7, 9 and 11 is reduced with the result that the temperatures of the MOSFETs 7, 9 and 11 rise.

The arms configuring the U-phase, V-phase and W-phase are sequentially arranged on the substrate 21 in the three-phase inverter circuit 3. In this case, when the arms are cooled sequentially from the U-phase toward the W-phase, cooling air is firstly subjected to heat from two elements located at the upstream side and then cools the elements located at the downstream side. Accordingly, as shown in FIG. 2A, it is desirable that cooling air be caused to flow from the positive element toward the negative element (or in a reverse direction) and that the cooling fins 23 be disposed along the flow of cooling air.

FIGS. 3A and 3B show a water (or oil) cooling system. A water passage 24 through which cooling water flows is disposed between the insulating material 22 and the cooling fins 23 in the board 21, as shown in FIG. 3B. The water passage 24 is disposed so that cooling water delivered to the water passage 24 by a circulation pump (not shown) firstly cools the negative MOSFETs 7, 9 and 11 and then flows in the opposite direction to cool the positive MOSFETs 10, 8 and 6. More specifically, the water passage 24 has a simple construction such that cooling water changes its direction once. In this case, too, the MOSFET 7 located at an entrance of cooling water is cooled with a highest efficiency, whereas the cooling efficiency for the MOSFET 6 located at an exit of cooling water is lowest, with the result that temperature difference between the MOSFETs 6 and 7 located at upper and lower sides of the U-phase arm respectively becomes larger.

As shown in FIGS. 2A to 3B, the cooling mechanism of the inverter circuit generally has an extreme difficulty in uniformly cooling all the switching elements for the reasons of space and costs, and temperatures of the switching elements unavoidably vary during operation of the inverter circuit. The embodiment employs the configuration as described below to cope with the above-described problem.

Figure 4:
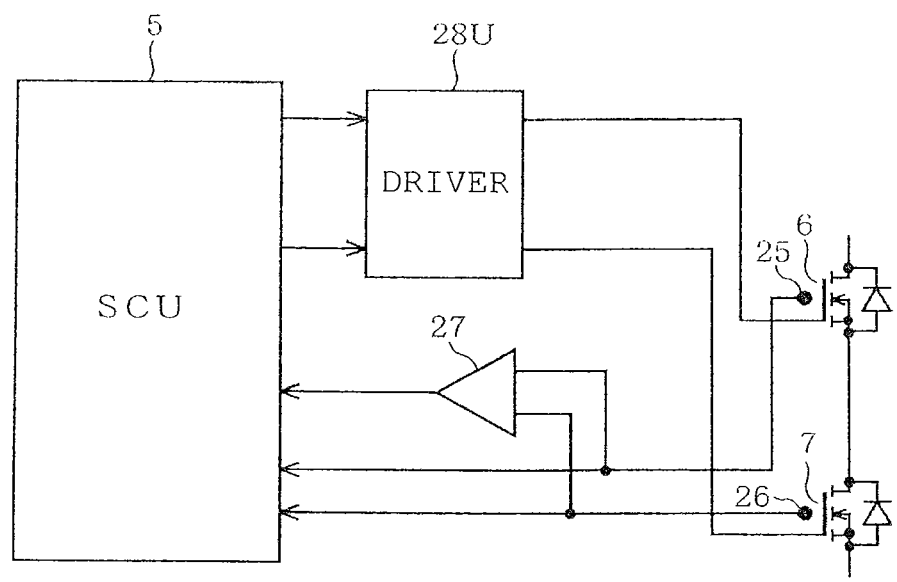
FIG. 4 is a schematic circuit diagram showing the configuration to detect temperature difference between positive and negative MOSFETs.

FIG. 4 shows the configuration to detect temperatures of MOSFETs. For example, the MOSFETs 6 and 7 of the U-phase of the inverter circuit 3 are provided with thermistors 25 and 26 (upper and lower temperature detection units) for detecting temperatures of the elements respectively. The thermistors 25 and 26 are disposed in proximity to the MOSFETs 6 and 7 respectively. Output signals of the thermistors 25 and 26 (corresponding to an upper side temperature and a lower side temperature respectively) are supplied to input terminals of the SCU 5. For example, the MOSFETs 6 and 7 are objects for temperature detection since the MOSFETs 6 and 7 belong to the arm in which temperature difference between the positive and negative sides becomes largest when the cooling mechanism as shown in FIGS. 3A and 3b is employed.

Output signals of the thermistors 25 and 26 are supplied to input terminals of a differential amplifier circuit 27 (a signal generation circuit) respectively. An output signal of the differential amplifier circuit 27 is supplied to an input terminal of the SCU 5. The thermistors 25 and 26 are of a negative temperature coefficient (NTC) type. FIG. 4 also shows a driver 28U via which the SCU 5 outputs gate signals to the MOSFETs 6 and 7. The driver 28U is a circuit applying a gate voltage having a potential difference of about 15 volts relative to the source when N-channel MOSFETs are used as the switching elements.

Figure 5:
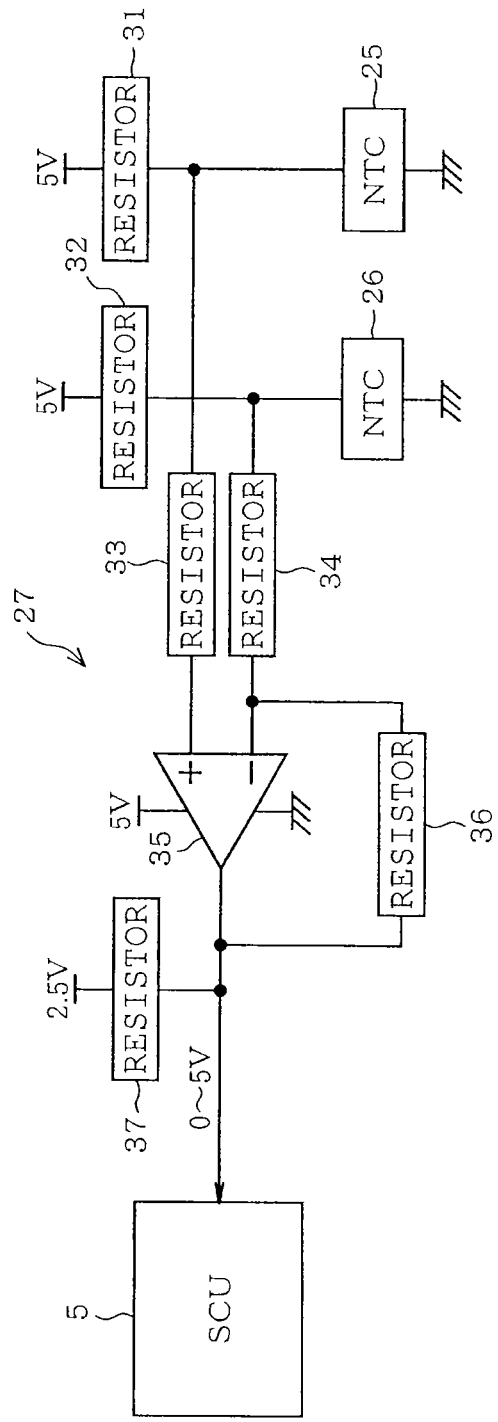
FIG. 5 is a schematic circuit diagram showing a differential amplifier circuit and its periphery.

FIG. 5 shows the configuration including the differential amplifier circuit 27 and its periphery in more concrete manner. The thermistors 25 and 26 configure series circuits together with resistors 31 and 32 respectively. The series circuits are connected between 5-V power supplies and the ground. The series circuits have common nodes which are connected via resistors 33 and 34 to a non-inverting input terminal and an inverting input terminal of an operational amplifier 35 respectively. The inverting input terminal is connected via a resistor 36 to an output terminal of the operational amplifier 35. The output terminal is pulled up via a resistor 37 to a 2.5-V power supply. An operating voltage of the operational amplifier 35 is 5 volts. As a result, the differential amplifier circuit 27 outputs to the SCU 5 an output signal (a differential amplification signal) according to the difference between detection temperatures detected by the thermistors 25 and 26 with a center value of 2.5 volts.

Figure 6:
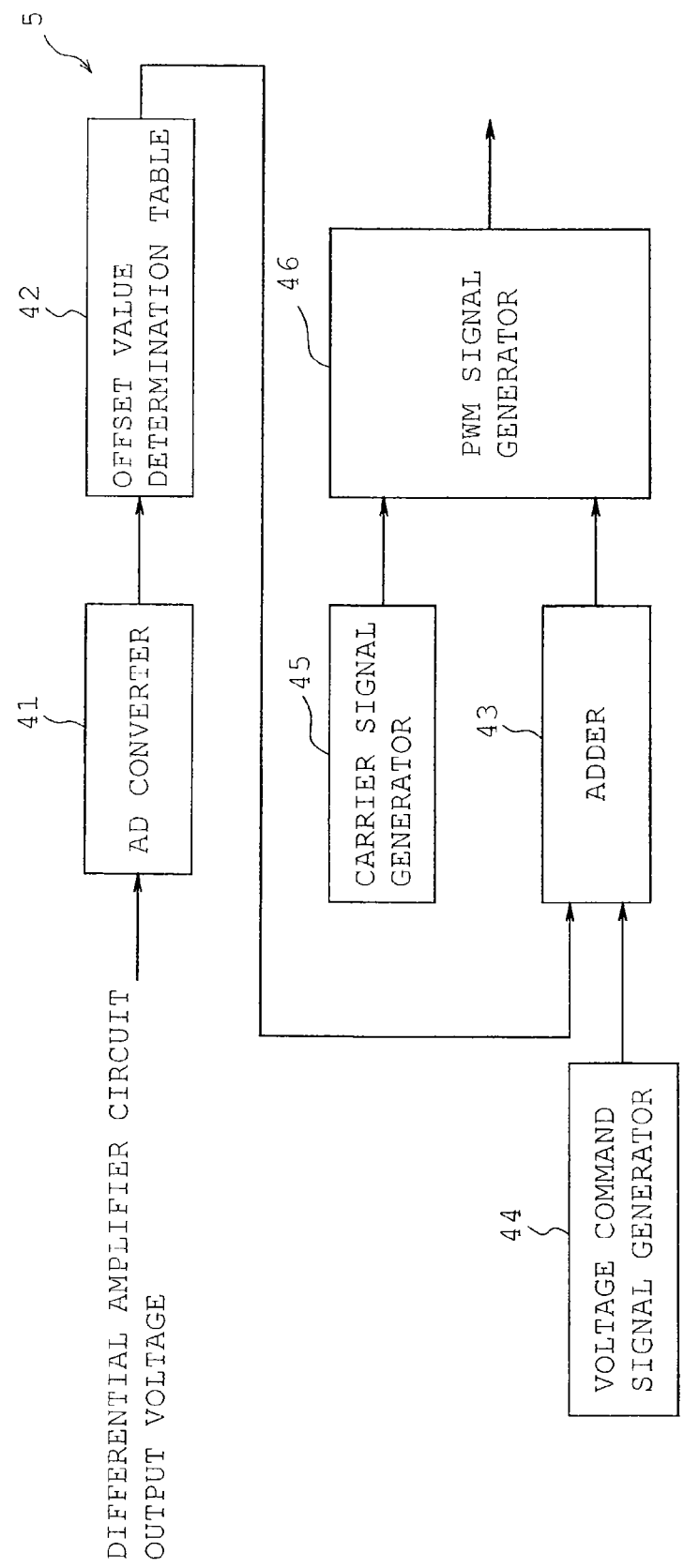
FIG. 6 is a functional block diagram showing a major part of the SCU.
Figure 7:
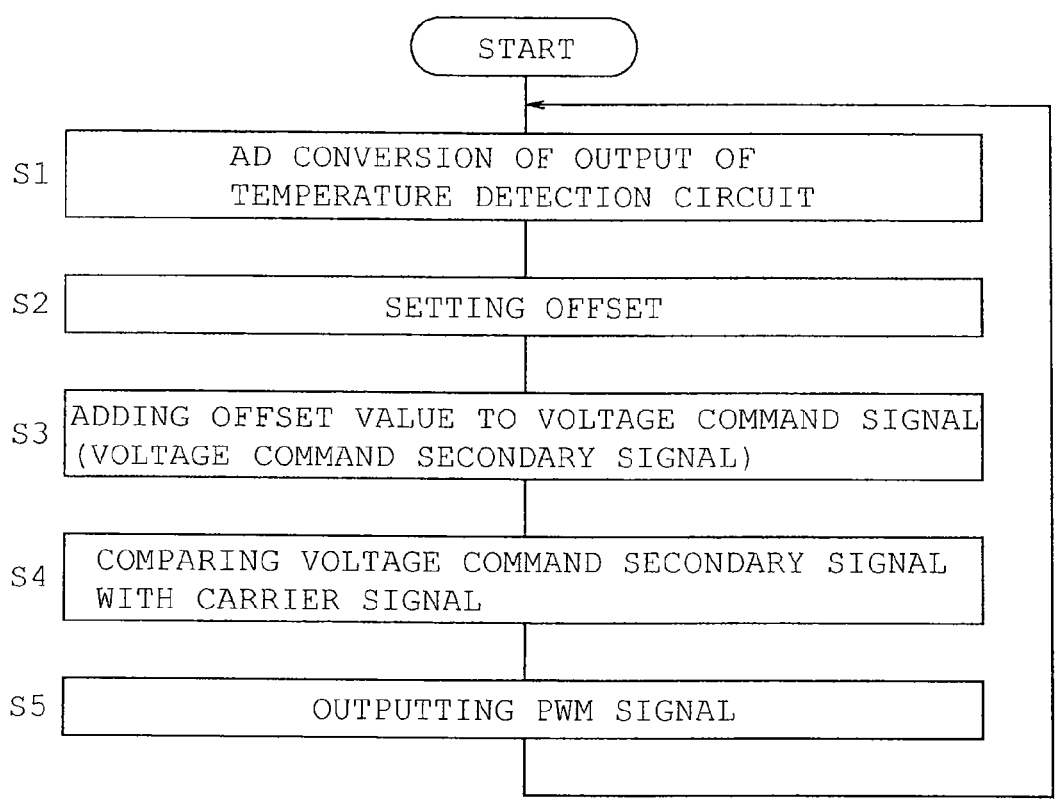
FIG. 7 is a flowchart showing processing contents executed by the configuration shown in FIG. 6.

FIG. 6 is a functional block diagram showing a function of generating PWM signals in an internal configuration of the SCU 5. FIG. 7 is a flowchart showing flow of processing by the hardware corresponding to the configuration shown in FIG. 6. The Output signal of the differential amplifier circuit 27 is input to an A/D converter 41 for A/D conversion of the signal (S1), and the converted data is input to a next-stage offset value determination table 42. The offset value determination table 42 outputs an offset value to an adder 43 (S2). The offset value is determined according to the output signal of the differential amplifier circuit 27, that is, the difference between the temperatures of the MOSFETs 6 and 7 detected by the thermistors 25 and 26 respectively.

A voltage command signal generator 44 inputs to the adder 43 a PWM voltage command having an amplitude change rate of sinusoidal wave with a predetermined period (three-phase sinusoidal waves with phase difference of 120 degrees). The adder 43 adds to the PWM voltage command an offset value input thereto from the offset value determination table 42 (a voltage command secondary signal), outputting the addition to the PWM signal generator 46 (S3). A carrier signal generator 45 for PWM signal generation outputs, for example, a triangular wave carrier signal to the PWM signal generator 46. The PWM signal generator 46 compares a level of the PWM voltage command input thereto from the adder 43, with a level of the carrier signal, generating a PWM signal (S4). The PWM signal is output via the driver 28 as shown in FIG. 4 to the gates of MOSFETs 6 to 11 configuring the inverter circuit 3 (S5).

The operation of the embodiment will now be described with reference to FIGS. 8A to 11. FIGS. 8A to 8C show a case where temperatures of the MOSFETs 6 and 7 detected by the thermistors 25 and 26 correspond with each other and the output voltage of the differential amplifier circuit 27 is 2.5 volts. FIG. 8A shows a carrier signal and three-phase PWM voltage command. The carrier signal has amplitude ranging from 0 to 5 volts, and the PWM voltage command is a sinusoidal wave changing with a center value of 2.5 volts (reference voltage). FIG. 8B shows partial enlargements of the U-phase voltage command and carrier signal shown in FIG. 8A. FIG. 8C shows a U-phase positive PWM signal generated based on the U-phase voltage command and carrier signal.

Figures 9A, 9B, 9C:
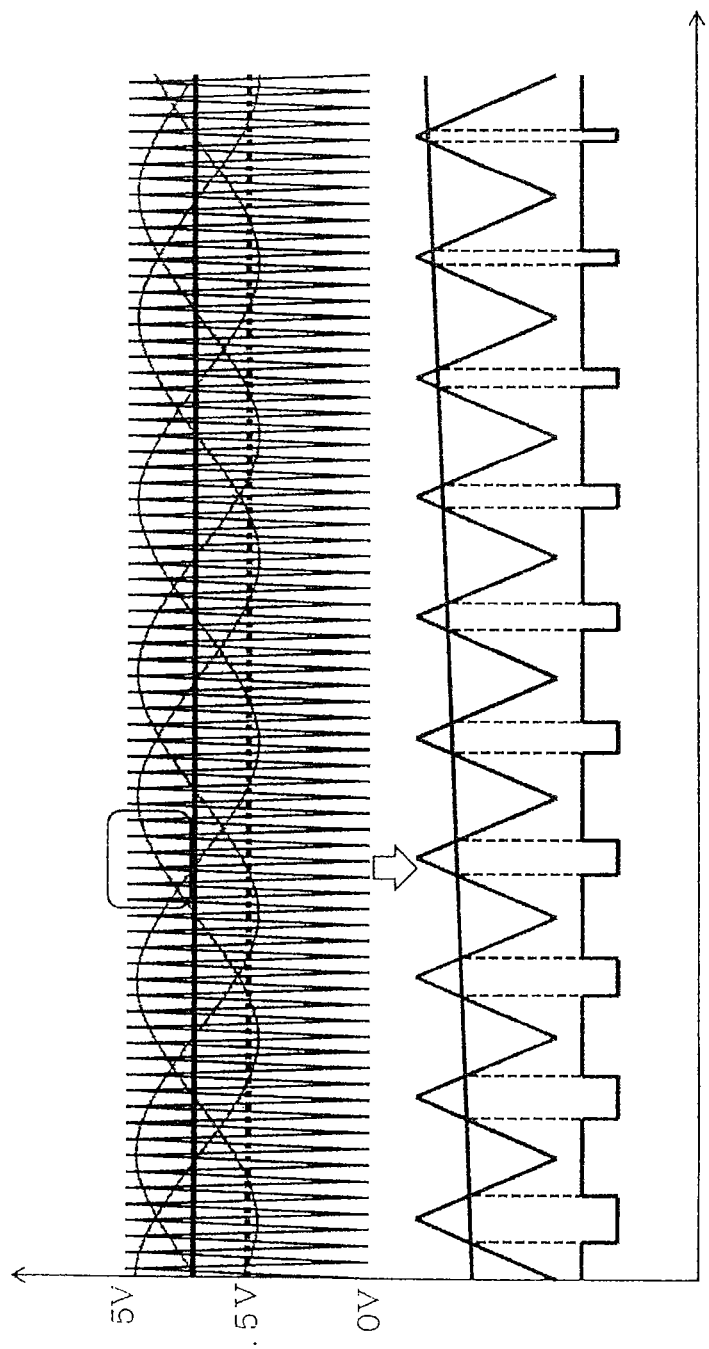
FIGS. 9A to 9C are graphs showing carrier signal, voltage command signal and U-phase positive PWM signal (reference voltage>2.5 volts)

On the other hand, FIGS. 9A to 9C show a case where the temperature of the MOSFET 7 is higher than the temperature of the MOSFET 6. In this case, since the potential of the non-inverting input terminal is higher than the potential of the inverting input terminal, the output voltage of the differential amplifier circuit 27 becomes higher than 2.5 volts. The PWM voltage command is then offset to the positive side, so that the PWM duty of the positive MOSFET 6 is increased. As a result, a turn-on time of the MOSFET 6 is rendered longer, whereas a turn-on time of the MOSFET 7 is rendered shorter. Accordingly, the temperature of the MOSFET 6 rises, whereas the temperature of the MOSFET 7 drops. The temperatures of the MOSFETs 6 and 7 are controlled in a feedback control manner so as to approximate to each other.

Figures 10A, 10B:
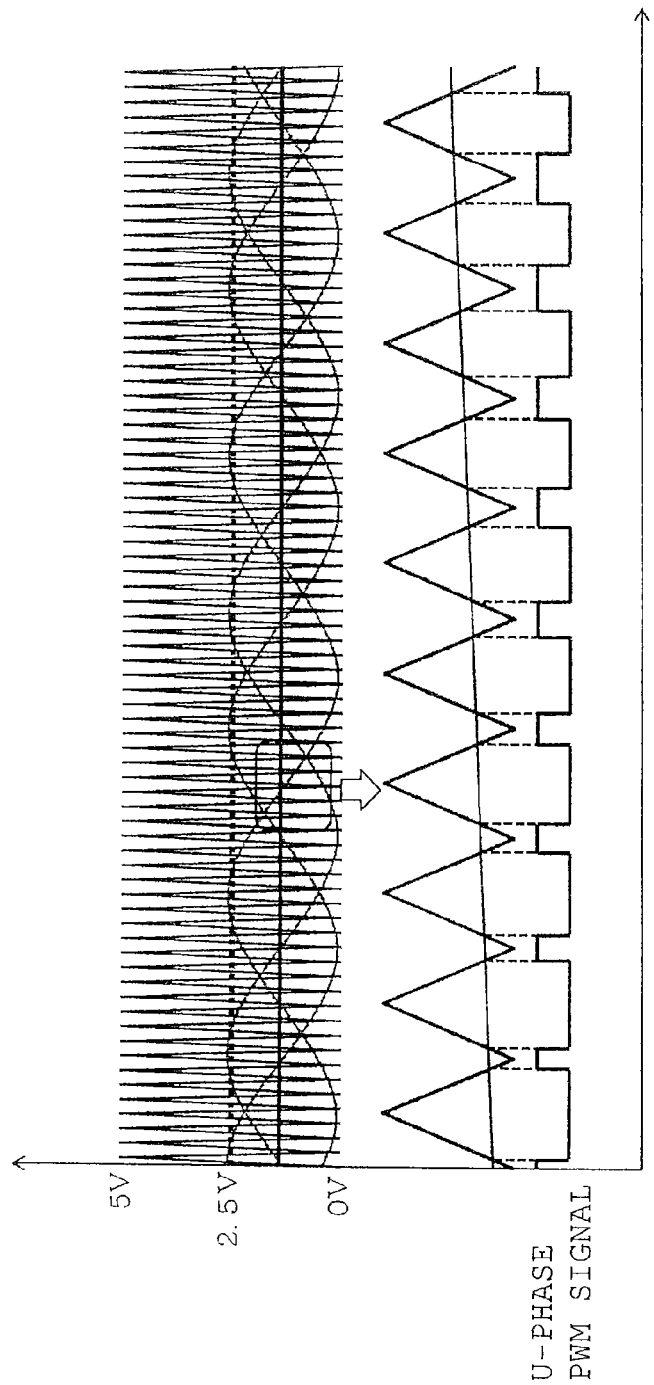

FIGS. 10A to 10C show a case where the temperature of the MOSFET 6 is higher than the temperature of the MOSFET 7, contrary to the case of FIGS. 9A-9C. In this case, the voltage relationship is reversed and the output voltage of the differential amplifier circuit 27 becomes lower than 2.5 volts. The PWM voltage command is then offset to the negative side, so that the PWM duty of the positive MOSFET 6 is reduced. As a result, a turn-on time of the MOSFET 6 is rendered shorter, whereas a turn-on time of the MOSFET 7 is rendered longer. Accordingly, the temperature of the MOSFET 6 drops, whereas the temperature of the MOSFET 7 rises. Accordingly, the temperatures of the MOSFETs 6 and 7 are controlled in the feedback control manner so as to approximate to each other.

Figure 11:
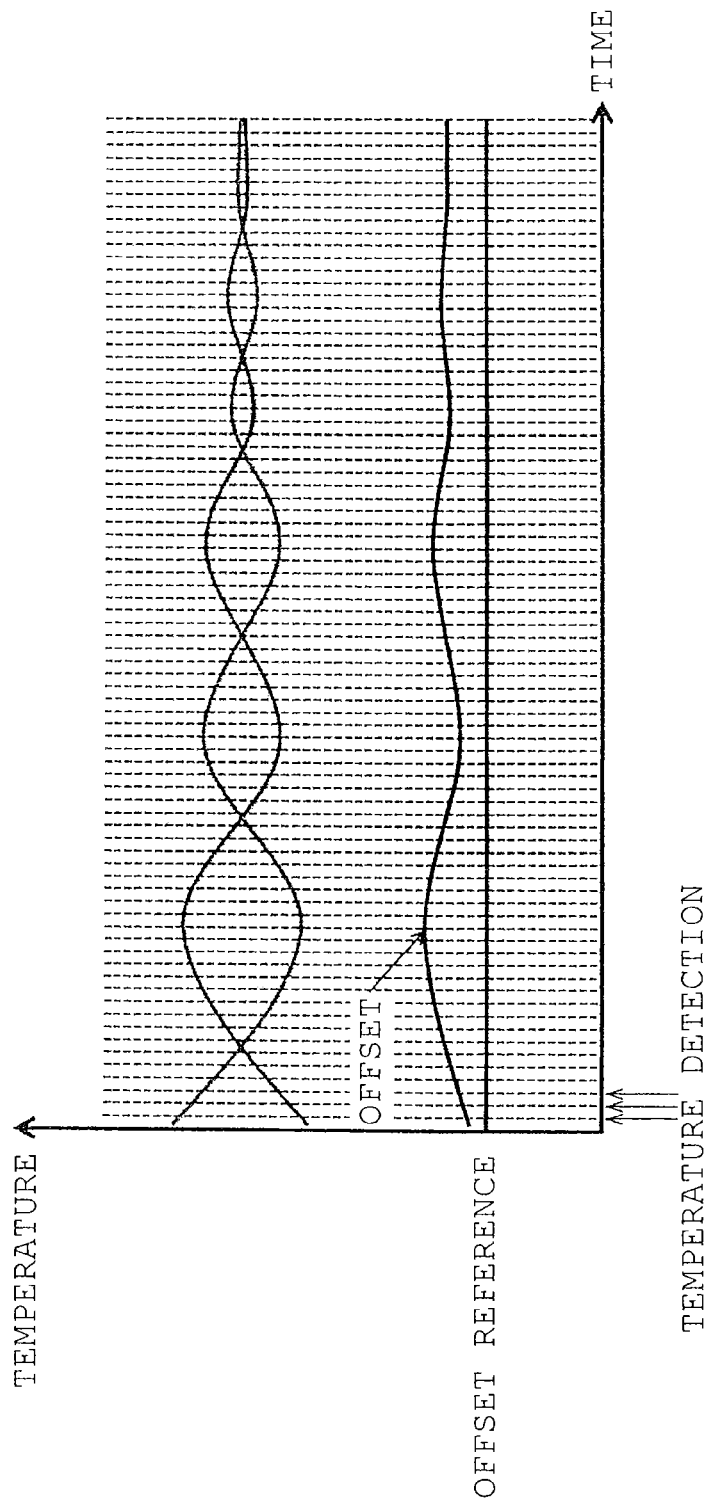
FIG. 11 shows an example of time-dependent changes in temperature difference between positive and negative MOSFETs and an offset value.

As the result of the above-described control manner, as shown in FIG. 11, the state where the temperature difference between the positive element (the upper element) and the negative element (the lower element) is changed so that the temperature difference is reduced by adding the offset value to the PWM voltage command, and the offset value becomes smaller with reduction in the temperature difference. Drive voltage applied to the motor 4 depends upon three-phase interline (interphase) voltage. Accordingly, since the interline voltage does not change even when the three-phase PWM voltage command is caused to rise or drop by the same offset value, the drive control of the motor 4 is not influenced.

According to the above-described embodiment, the temperatures of the MOSFETs 6 and 7 configuring the inverter circuit 3 are detected by the thermistors 25 and 26 respectively. The SCU 5 adds the offset value to the command voltage of the PWM signal so that both temperatures approximate to each other thereby to generate the PWM signal, which is output to the gates of the MOSFETs 6 and 7. As a result, the duties of the PWM signals output to the gates of the MOSFETs 6 and 7 are adjusted according to the temperature difference between the MOSFETs with the result that the operation of the inverter circuit 3 can be continued while the temperature difference between the MOSFETs 6 and 7 is rendered as small as possible. Accordingly, the temperature of the MOSFET in which heat rate is increased is reduced so that the heat generation balances are equalized with the result that an output performance of the motor control system can be improved.

In this case, the output voltages of the thermistors 25 and 26 are input to the two input terminals of the differential amplifier circuit 27 respectively, and the SCU 5 determines the offset value according to the output voltage of the differential amplifier circuit 27. Accordingly, the offset value can easily be determined only with reference to the output voltage. Further, of the U-, V- and W-phase arms, the U-phase arm includes the MOSFETs 6 and 7 between which the temperature difference becomes larger. The offset value is added to the PWM voltage command so that the temperature difference between the MOSFETs 6 and 7 of the U-phase arm is reduced. Consequently, the temperature difference can be reduced since the PWM signal added with the offset value is generated and output regarding the arm in which the temperature difference is larger. This can reduce the maximum heat generation temperature of the switching element and improve the maximum output performance of the motor control system.

Figure 12:
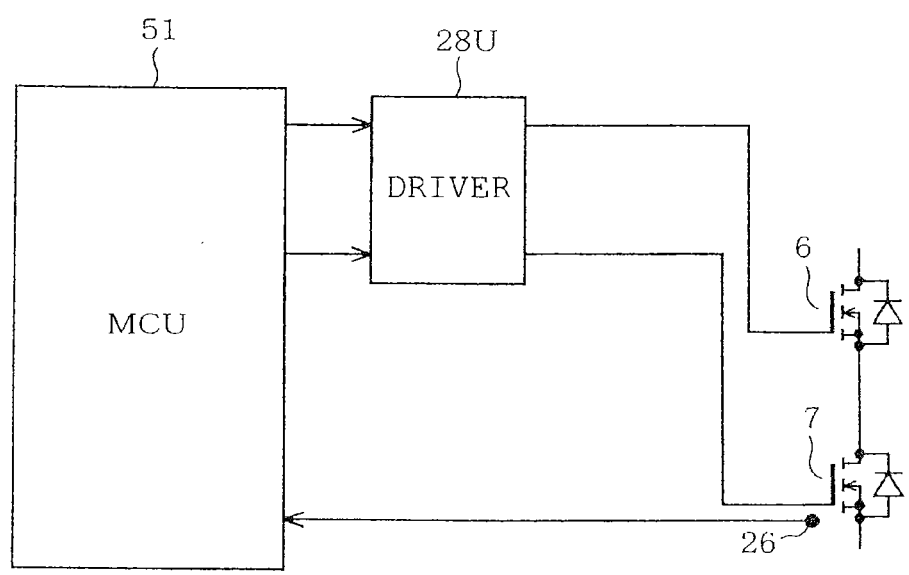
FIG. 12 is a schematic circuit diagram showing configuration to detect temperature difference between positive and negative MOSFETs in a second embodiment.
Figure 13:
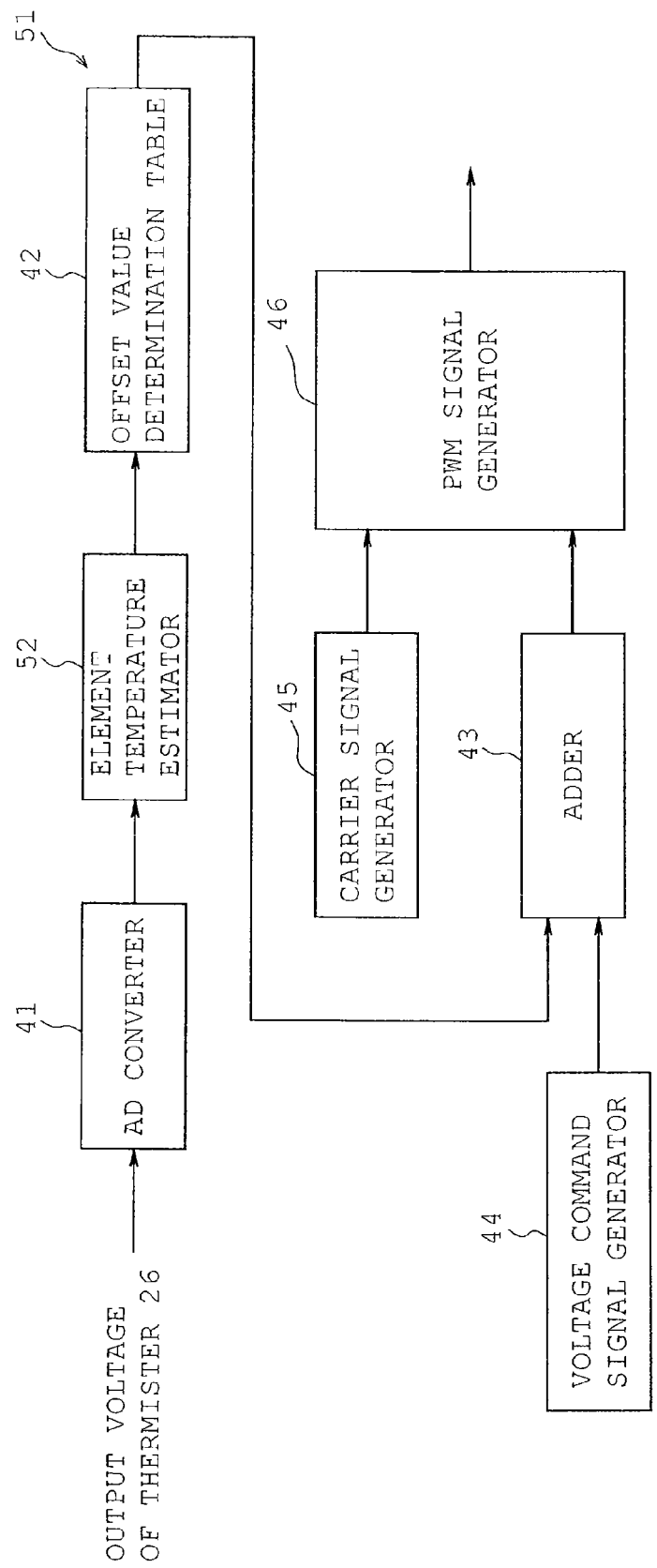
FIG. 13 is a functional block diagram showing a major part of the inner configuration of SCU.
Figure 14:
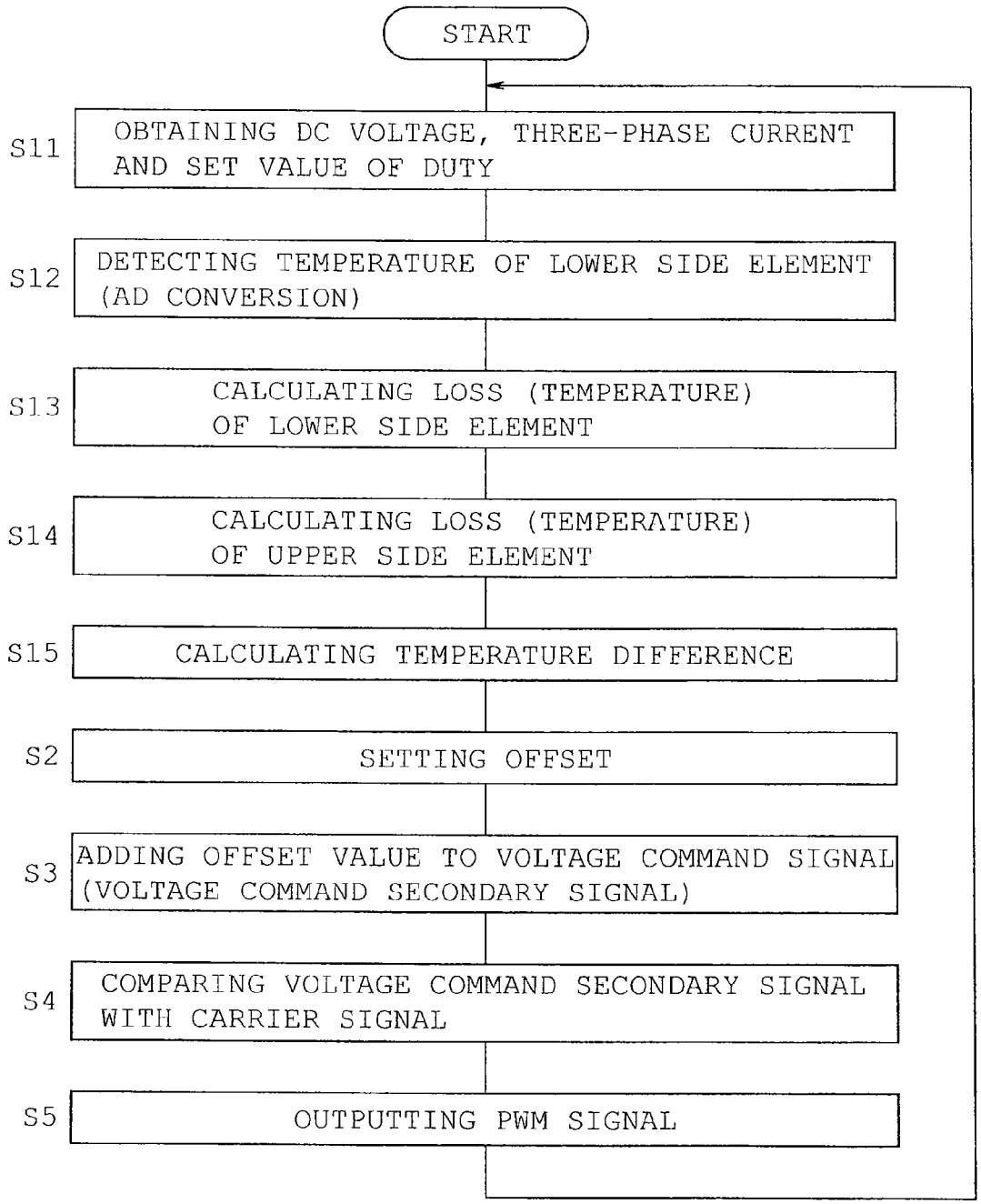
FIG. 14 is a flowchart showing contents of processing executed by the configuration shown in FIG. 13.

FIGS. 12 to 14 illustrates a second embodiment. Identical or similar parts in the second embodiment are labeled by the same reference symbols as those in the first embodiment and the description of these parts will be eliminated. Only the difference between the first and second embodiments will be described. Referring to FIG. 12 corresponding to FIG. 4, only the negative MOSFET 7 includes the thermistor 26. When calculating losses generated in the respective MOSFETs 6 and 7 based on the temperature of the MOSFET 7 detected by the thermistor 26, the SCU 51 provided instead of the SCU 5 estimates temperatures from the losses in consideration of thermal resistance in the periphery of the element. Referring to FIG. 13, the A/D converter 41 executes A/D conversion of the voltage output by the thermistor 26, outputting the result of conversion to an element temperature estimator (a temperature estimation unit) 52. The temperature difference of the MOSFETs 6 and 7 obtained from the result of estimation by the element temperature estimator 52 is input to the offset value determination table 42, so that an offset value is determined.

The operation of the second embodiment will be described with reference to FIG. 14. Firstly, the element temperature estimator 52 obtains the DC power supply voltage, phase currents and a set duty value (a control parameter varying based on the switching control) of the phase to be detected (S11). The A/D converter 41 executes A/D conversion of the power supply voltage and phase currents and the result of A/D conversion is read. The A/D converter 41 then executes A/D conversion of the output voltage (temperature) of the thermistor 26. When reading the result of A/D conversion (S12), the temperature estimator 52 calculates loss generated in the MOSFET 7 from the temperature of the MOSFET 7 and a control parameter obtained at step S11 (S13). Further, as described above, the temperature estimator 52 estimates from the obtained loss a temperature assumed to be approximate to an actual state of the MOSFET 7.

The SCU 51 then obtains loss (and temperature) of the MOSFET 6 from the loss of the MOSFET 7 (S14). More specifically, since the MOSFETs 6 and 7 located at the upper and lower sides of the same phase arm have a certain correlation regarding the current losses, the loss generated in the MOSFET 6 can be obtained by calculation. The temperature difference is then calculated from the temperatures of the MOSFETs 6 and 7 obtained at steps S13 and S14, and the obtained temperature difference is output to the offset value determination table 42 (S15). Subsequently, steps S2 to S5 are executed in the same manner as in the first embodiment.

According to the second embodiment, the temperature estimator 52 of the SCU 51 calculates the losses generated in the MOSFETs 6 and 7 based on the temperature of the MOSFET 7 detected by the thermistor 26, the DC power supply voltage, the phase currents, the duty of the phase to be detected and the like. When estimating temperatures of the elements from the calculated losses in consideration of heat resistance in the peripheries of the elements, the temperature estimator determines the offset value from the temperature difference between the estimated temperatures. Accordingly, when only the temperature of either one element is detected, the temperature difference of the positive and negative elements can be estimated and the offset value can be determined.

In the first embodiment, the SCU 5 may directly read the output voltages of the thermistors 25 and 26 and obtain the temperature difference between the MOSFETs 6 and 7 by calculation, without use of the differential amplifier circuit 27.

Further, the object whose temperature is detected should not be limited to the MOSFETs 6 and 7. The elements belonging to the arm considered as optimum may be selected based on the structure of the cooling mechanism or the like employed according to individual design.

In the second embodiment, the temperature of the MOSFET 6 may be detected and the temperature of the MOSFET 7 may be estimated. Further, a diode may be used as the temperature detection unit.

The carrier signal may have a saw-tooth waveform.

The voltage command signal should not be limited to that having an amplitude change rate of sinusoidal wave.

Each one of phase arms of the three-phase inverter circuit 3 may include two or more parallel groups of switching elements (n≥2) when each group includes six switching elements as in the foregoing embodiments.

Each switching element should not be limited to the N-channel MOSFET but may be a P-channel MOSFET, IGBT, bipolar transistor or the like.

The drive circuit may be an H bridge circuit or a half bridge circuit.

The switching control device may be applied to a system which is provided with no cooling mechanism for the drive circuit.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A switching control device controlling a drive circuit including one or more series circuits each one of which includes an upper switching element and a lower switching element, the switching control device comprising:
    an upper side temperature detection unit detecting a temperature of the upper switching element (hereinafter, "an upper side temperature");
    a lower side temperature detection unit detecting a temperature of the lower switching element (hereinafter, "a lower side temperature"); and
    a signal generation circuit adding an offset value to a command voltage of a PWM signal output to the upper and lower switching elements to generate and output a PWM signal to the switching elements so that the upper and lower side temperatures approximate to each other.

2. The switching control device according to claim 1, wherein the signal generation circuit includes a differential amplifier circuit having two input terminals to which an output signal of the upper temperature detection unit and an output signal of the lower temperature detection unit are input respectively, and the signal generation circuit determines the offset value according to an output voltage of the differential amplifier circuit.

3. A switching control device controlling a drive circuit including one or more series circuits each one of which includes an upper switching element and a lower switching element, the switching control device comprising:
    a temperature detection unit detecting a temperature of either upper or lower switching element;
    a temperature estimation unit estimating a temperature of the upper switching element (hereinafter, "an upper side temperature") and a temperature of the lower switching element (hereinafter, "a lower side temperature") based on the detected temperature and a control parameter varying based on switching control; and
    a signal generation circuit adding an offset value to a command voltage of a PWM signal output to the upper and lower switching elements to generate and output a PWM signal to the switching elements so that the upper and lower side temperatures approximate to each other.

4. The switching control device according to claim 1, wherein the drive circuit has a three-phase configuration including 3n number of the series circuits where n is a natural number; and
    wherein the signal generation circuit targets at one of the 3n 1 number of the series circuits, in which the temperature difference between the upper side temperature and the lower side temperature is maximum.

5. The switching control device according to claim 2, wherein the drive circuit has a three-phase configuration including 3n number of the series circuits where n is a natural number; and
    wherein the signal generation circuit targets at one of the 3n number of the series circuits, in which the temperature difference between the upper side temperature and the lower side temperature is maximum.

6. The switching control device according to claim 3, wherein the drive circuit has a three-phase configuration including 3n number of the series circuits where n is a natural number; and
    wherein the signal generation circuit targets at one of the 3n number of the series circuits, in which the temperature difference between the upper side temperature and the lower side temperature is maximum.

* * * * *